(12) United States Patent
Komatsu

(10) Patent No.: US 7,777,223 B2
(45) Date of Patent: Aug. 17, 2010

(54) SEMICONDUCTOR DEVICE

(75) Inventor: Shigeyuki Komatsu, Kyoto (JP)

(73) Assignee: Pansonic Corporation, Osaka (JP)

( * ) Notice: Subject to any disclaimer, the term of this patent is extended or adjusted under 35 U.S.C. 154(b) by 285 days.

(21) Appl. No.: 10/593,277

(22) PCT Filed: Mar. 15, 2005

(86) PCT No.: PCT/JP2005/004571

§ 371 (c)(1),
(2), (4) Date: Aug. 14, 2008

(87) PCT Pub. No.: WO2005/088702

PCT Pub. Date: Sep. 22, 2005

(65) Prior Publication Data

US 2008/0308798 A1     Dec. 18, 2008

(30) Foreign Application Priority Data

Mar. 16, 2004  (JP) ............................. 2004-074283

(51) Int. Cl.
*H01L 23/58* (2006.01)
(52) U.S. Cl. ............ 257/48; 257/E25.001; 257/E23.002
(58) Field of Classification Search .................. 257/48, 257/401, 499, 503, 734, 784, E33.002, E25.001; 438/14, 15, 17, 18
See application file for complete search history.

(56) References Cited

U.S. PATENT DOCUMENTS

| 6,803,302 | B2 | 10/2004 | Pozder et al. | |
| 2001/0051426 | A1* | 12/2001 | Pozder et al. | ............... 438/666 |
| 2003/0173668 | A1 | 9/2003 | Downey et al. | |
| 2004/0089912 | A1* | 5/2004 | Komatsu | ................... 257/503 |
| 2005/0014356 | A1 | 1/2005 | Pozder et al. | |

FOREIGN PATENT DOCUMENTS

| EP | 0 587 442 | * | 9/1993 |
| EP | 0 587 422 | A2 | 3/1994 |
| JP | 58-200526 | | 11/1983 |
| JP | 6-204277 | A | 7/1994 |
| JP | 10-242226 | | 9/1998 |

(Continued)

OTHER PUBLICATIONS

Japanese Office Action issued in Japanese Patent Application No. 2005-073682, issued on Feb. 23, 2010.

*Primary Examiner*—Thomas L Dickey
*Assistant Examiner*—Nikolay Yushin
(74) *Attorney, Agent, or Firm*—McDermott Will & Emery LLP

(57) ABSTRACT

A semiconductor device in which size reduction is possible without functional devices below pads being damaged by stress. The semiconductor device has a plurality of pads above a semiconductor substrate as terminals for external connection. A plurality of dual use pads which are used in both a probing test and assembly are provided in a first area above a main surface of the semiconductor substrate, an application of pressure by a probe during the probing test being permitted in the first area, and a plurality of assembly pads which are not used in the probing test are provided in a second area above the main surface of the semiconductor substrate, the application of pressure by the probe during the probing test being not permitted in the second area.

3 Claims, 17 Drawing Sheets

FOREIGN PATENT DOCUMENTS

| | | |
|---|---|---|
| JP | 11-307601 A | 11/1999 |
| JP | 2000-164620 A | 6/2000 |
| JP | 2000-1646620 * | 6/2000 |
| JP | 2000-232127 * | 8/2000 |
| JP | 2000-232127 A | 8/2000 |
| JP | 2001-156070 A | 6/2001 |

* cited by examiner

SEMICONDUCTOR DEVICE

RELATED APPLICATIONS

This application is the U.S. National Phase under 35 U.S.C. §371 of International Application No. PCT/JP2005/004571, filed on Mar. 15, 2005, which in turn claims the benefit of Japanese Application No. 2004-074283, filed on Mar. 16, 2004, the disclosures of which Applications are incorporated by reference herein.

TECHNICAL FIELD

The present invention relates to a semiconductor device, and in particular to a technique for reducing semiconductor size without damaging functional devices due to probing during wafer testing and bonding and bumping during assembly.

BACKGROUND ART

In recent years, there have been remarkable advancements in semiconductor processes. The size of semiconductor integrated circuits is being reduced yearly, bringing a reduction in the size of semiconductor chips as well.

As the size of semiconductor chips is reduced, the number manufactured per wafer increases, and yields also tend to rise, allowing for a steady decline in cost.

On the other hand, pads used for external connection during testing and assembly must be included on the surface of a semiconductor chip. Given that there are individual constraints on the sizes and disposition of the pads during testing and assembly, the size of the pad disposition area has not currently been reduced very much.

Consequently, the percentage of the entire area of semiconductor chips which the pad disposition area occupies increases yearly and is an obstacle to the reduction in size of semiconductor chips.

With high-performance multi-pin semiconductor chips in particular, a pad constraint occurs whereby a chip's size is determined solely by the disposition of the pads, regardless of the circuit dimensions of the semiconductor integrated circuit. However remarkable the improvements in semiconductor processing may be, a significant reduction in the dimensions of multi-pin semiconductor chips cannot be expected as long as the dimensions of the pad disposition area are not reduced.

A method that prevents the size of the semiconductor chip from being affected by the size of the pad disposition area is disclosed in patent document 1 whereby pads are disposed above a given circuit device formation area.

Since the pads are disposed on the functional devices in the method in patent document 1, stress from probe pressure, etc. is applied on the interface beneath the pad during wafer testing, with the functional devices beneath the pads becoming more susceptible to damage as the miniaturization of semiconductor processing advances. A serious problem thus resides in the method of patent document 1 in terms of reliability.

In view of this, damage due to stress is avoided in patent document 1 by adequately increasing the pad thickness to 15000 Å and lowering the pressure of the probe from the conventional 10 g/pin to 5 g/pin.

Patent document 1: Japanese Patent Application Publication No. 11-307601 (p. 5, FIG. 1)

DISCLOSURE OF THE INVENTION

Problems Solved by the Invention

In current miniaturized semiconductor processes, the thickness of metal wiring is approximately 5000 Å, making it impossible to avoid damage from the above stress using the thickness of the pad.

In recent years, wafer testing has often been performed on multiple semiconductor chips at the same time in order to raise operating efficiency. When using a single mechanism to apply probes to the pads of semiconductor chips, there are variations in probe pressure. Given that it is necessary to ensure a minimum probe pressure for all the probes, the probe pressure must be raised.

In semiconductor chips with nonvolatile memory, different measuring devices are used for the memory and for the other logics, and thus stress from probe pressure occurs multiple times with the different measuring devices.

The probe tips have changed from flat-shape to honed-shape (pointed) with a smaller contact area to cope with multipin semiconductor chips, although stress is focused on a narrow range in these honed-shape tips.

As described above, there are many factors behind the damage to functional devices beneath the pads by probe pressure, thereby making it impossible to apply the method in patent document 1 without adopting measures of some sort.

In light of this, the object of the present invention is to provide a semiconductor device whose dimensions can be reduced without the functional devices beneath the pads suffering damage from stress.

Means to Solve the Problems

To achieve the above object, a semiconductor device pertaining to the present invention has, over a semiconductor substrate, a plurality of pads that are terminals for external connection. A first area above a main surface of the semiconductor substrate, where pressure by a probe during a probing test is permitted, has a plurality of dual use pads which are used for both the probing test and assembly. A second area above the main surface of the semiconductor substrate, where pressure by a probe during the probing test is not permitted, has a plurality of assembly pads which are not used in the probing test.

Effects of the Invention

According to a semiconductor device which solves the above issues, assembly pads are disposed in an area where pressure by a probe during the probing test is not permitted, and dual use pads and probing test pads are alternately disposed in an area where pressure by a probe during the probing test is permitted. This prevents functional devices beneath the pad from being damaged by stress, enables the pad pitch and the area where pressure during the probing test is permitted to be reduced in comparison to the prior art, and enables a substantial reduction in chip size.

In the semiconductor device, the dual use pads may have a shape compatible with both assembly and connection with the probe, and the assembly pads may have a shape compatible with only assembly.

In the semiconductor device, the first area may correspond to an area above a peripheral region of the main surface of the semiconductor substrate, and the dual use pads may be arranged linearly along a periphery of the main surface of the semiconductor substrate.

As a result of the above, in a case in which it is permissible to have fewer probing test pads than assembly pads, the length of the dual use pads in a direction perpendicular to the pad pitch direction can be reduced to the extent that the measurement is not subject to the slippage constraint of narrow-pitch probes, thereby enabling chip size to be further reduced.

In the semiconductor device, the plurality of pads may further include probing test pads which are not used in assembly, and the probing test pads may be further provided in the first area.

In the semiconductor device, the dual use pads may have a shape compatible with both assembly and connection with the probe, the assembly pads may have a shape compatible with only assembly, the probing test pads may have a shape compatible with only connection with the probe, and a measurement in a pad pitch direction of the shape compatible with only connection with the probe may be smaller than a measurement in the pad pitch direction of the shape compatible with only assembly.

In the semiconductor device, the first area may correspond to the area above the peripheral region of the main surface of the semiconductor substrate, and the dual use pads and the probing test pads may be arranged alternately and along the periphery of the main surface of the semiconductor substrate.

As a result, when the measurement in the pad pitch direction of the shape compatible with having the probe connected thereto is smaller than the measurement in the pad pitch direction of the shape compatible with only assembly, this prevents functional devices beneath the pad from being damaged by stress, enables the pad pitch and the area where pressure during the probing test is permitted to be reduced in comparison to the prior art, and enables a substantial reduction in chip size.

In order to achieve the above object, a semiconductor device pertaining to the present invention has a plurality of connection pads that are terminals for external connection positioned in a top layer above a main surface of a semiconductor substrate, and at least one wiring pad positioned in an inner layer between the semiconductor substrate and the connection pads. In an overlap area, being a portion where the at least one wiring pad overlaps part or all of the connection pads when viewed from the main surface of the semiconductor substrate, a potential of the wiring pad is the same as a potential of the connection pads.

In the semiconductor device, the connection pads may be dual use pads used in both a probing test and assembly, whose shape is compatible with both assembly and connection with a probe.

As a result, by constituting the source area diffusion layer below the pad without metal wiring, crack-shorts fail to occur structurally even if pressure is applied to the pad since metal wiring which has a potential different from the pad is excluded from the interface beneath the pad.

Consequently, this drastically increases the degree of freedom in the pad layout, thereby facilitating the reduction of chip size.

In the semiconductor device, the at least one wiring pad in the overlap area may be connected to a drain of a transistor formed in the semiconductor substrate, and a shape of the overlap area may be substantially the same as the shape of the connection pads.

As a result, the fact that the bottom metal layer is substantially the same size as the pad means that even if a crack occurs in the interface beneath the pad from stress from a probe, bonding, etc., the bottom metal layer effectively functions as a cover layer in order to prevent malfunctions, thereby enabling an increase in the reliability of the semiconductor chip.

In the semiconductor device, a connection of a transistor gate may be extended by a thin film formed on a surface of the semiconductor substrate at the portion which overlaps a connection pad, and by the at least one wiring pad at a portion which does not overlap the connection pads.

As a result, the resistance of the source area diffusion layer is lowered, which is highly desirable.

In the semiconductor device, the connection pads may be composed of a portion used in the probing test and another portion, and the overlap area may be a portion where the at least one wiring pad and the portion used in the probing test overlap when viewed from the main surface of the semiconductor substrate.

In the semiconductor device, the connection pads may be dual use pads used in both the probing test and assembly, a shape of the portion used in the probing test may be compatible with connection with the probe, and a shape of a portion used in assembly may be compatible with only assembly.

As a result, this prevents functional devices in the portion used in the probing test from being damaged by stress, enables the pad pitch and the area where pressure during the probing test is permitted to be reduced in comparison to the prior art, and enables a substantial reduction in chip size.

In the semiconductor device, the at least one wiring pad may have two layers, and a via may not be formed between a first and second layer of the portion where the at least one wiring pad and the connection pads overlap when viewed from the main surface of the semiconductor substrate.

As a result, it is simple to analyze cracks between the bottom metal layer and the semiconductor substrate since there is no connection between the pad and the bottom metal layer below the pad interface.

Figure 1:
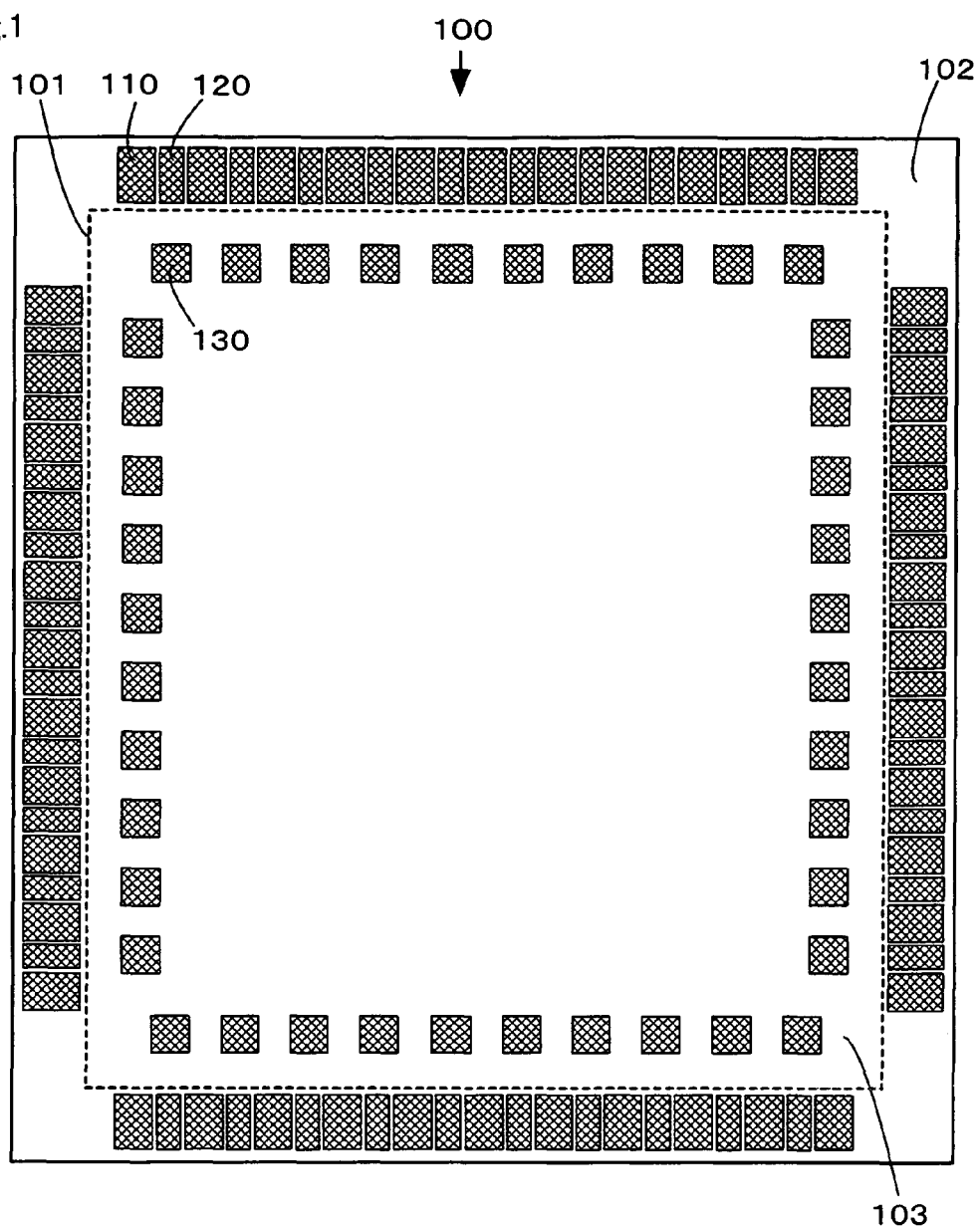
FIG. 1 shows a layout of a plurality of pads that are terminals for external connection, when viewing a semiconductor chip 100 in a first embodiment of the present invention from a main surface.

DESCRIPTION OF THE CHARACTERS 100 semiconductor chip
101 virtual boundary line
102 first area
103 second area
104 electrical insulating layer
110 dual use pad
111 pad opening
112 uppermost metal wiring layer
113 metal wiring layer
114 contact cluster
115 pad slot
116 contact
117 contact
118 bottom metal layer
119 contact
120 probing test pad
121 pad opening
122 uppermost metal wiring layer
123 metal wiring layer
124 contact cluster
125 pad slot
126 contact
127 contact
128 bottom metal layer
129 contact
130 assembly pad
131 pad opening
132 uppermost metal wiring layer
133 metal wiring layer
134 contact cluster
135 pad slot
136 contact
137 contact
140 semiconductor substrate
141 diffusion area
142 diffusion area
151 probe
152 bump
153 probe
154 bump
200 semiconductor chip
201 virtual boundary line
202 first area
203 second area
204 electrical insulating layer
210 dual use pad
211 pad opening
212 uppermost metal wiring layer
213 metal wiring layer
214 contact cluster
215 pad slot
216 contact
217 contact
218 bottom metal layer
219 contact
220 assembly pad
221 pad opening
222 uppermost metal wiring layer
223 metal wiring layer
224 contact cluster
225 pad slot
226 contact
227 contact
228 bottom metal layer
229 contact
230 semiconductor chip
231 diffusion area
232 diffusion area
241 probe
242 bump
243 bump
300 semiconductor chip
301 electrical insulating layer
310 dual use pad
311 pad opening
312 uppermost metal wiring layer
313 metal wiring layer
314 contact cluster
315 contact cluster
316 contact cluster
317 bottom metal layer
318 contact cluster
319 contact cluster
320 metal wiring
321 uppermost metal wiring layer
322 metal wiring layer
323 contact cluster
324 contact cluster
325 bottom metal layer
326 contact cluster
330 metal wiring
331 uppermost metal wiring layer
332 metal wiring layer
333 contact cluster 334 contact cluster
335 bottom metal layer
336 contact cluster
340 gate electrode
341 gate oxide film
342 contact
343 wiring layer
350 gate electrode
351 gate oxide film
352 contact
353 wiring layer
360 p-type semiconductor substrate
361 n-type well
362 diffusion area
363 diffusion area
364 diffusion area
365 diffusion area
400 semiconductor chip
415 contact cluster
416 contact cluster
417 bottom metal layer
500 semiconductor chip
510 dual use pad
511 uppermost metal wiring layer
512 metal wiring layer
513 contact cluster
514 pad slot
515 contact cluster
516 contact cluster
520 metal wiring
521 uppermost metal wiring layer
522 metal wiring layer
523 contact cluster

BEST MODE FOR CARRYING OUT THE INVENTION

Embodiment 1

Overview

In a first embodiment of the present invention, which proposes a new pad layout for semiconductor chips that enables the reduction of chip size, pads exclusively for assembly are disposed in areas where the probing test is not permitted, while pads exclusively for the probing test and dual use pads for the probing test and assembly are alternately disposed in areas where the probing test is permitted.

Structure

FIG. 1 shows a layout of a plurality of pads that are terminals for external connection, when viewing a semiconductor chip 100 in the first embodiment of the present invention from a main surface.

As shown in FIG. 1, the main surface of the semiconductor chip 100 is divided into a first area 102 which corresponds to an outer frame portion of the semiconductor chip 100 between a virtual boundary line 101 and the periphery, and a second area 103 which is the portion inside the virtual boundary line 101.

The first area 102 is an area where pressure by a probe during the probing test is permitted. Dual use pads 110, used in both the probing test and assembly, and probing test pads 120, not used in assembly, are disposed alternately in this area and along the periphery at a predetermined interval necessary in assembly.

Directly below the second area 103, in the interior of the semiconductor chip 100, there is a circuit formation portion (not shown) which has functional devices realizing the chip's unique functions. The second area 103 is an area where pressure by a probe during the probing test is not permitted in order to avoid damage to the circuit formation portion. Assembly pads 130, which are not used in the probing test, are arranged in this area along the virtual boundary line 101. Here, the assembly pads 130 and probing test pads 120 are of equal numbers, and are arranged at a predetermined interval necessary in assembly so that as pairs, their center lines relative to the pad pitch direction are substantially aligned.

Figure 2:
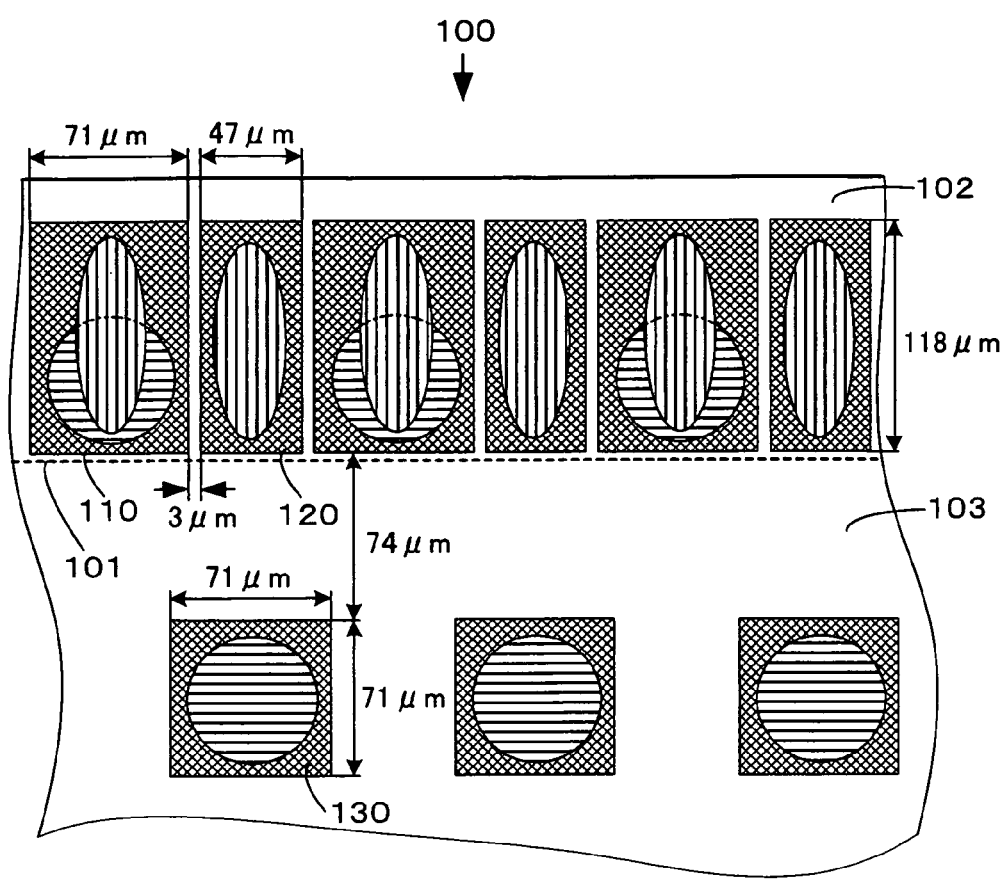
FIG. 2 shows details of shapes and a disposition of the pads.

FIG. 2 shows details of shapes and a disposition of the pads.

In FIG. 2, the circles with horizontal stripes show site occupancy for bonding or bumping, etc. in assembly, and the ellipses with vertical stripes show site occupancy for probing in the probing test.

The minimum dimensions for an assembly pad where stable bonding, bumping, etc. on the pad surface are possible are defined to be a width of 71 μm and a length of 71 μm. The minimum dimensions for a probing test pad where probing is possible, with consideration for slippage of a probe tip on the pad surface, are defined to be a width of 47 μm and a length of 118 μm. Given this, the dimensions and layout of the pads are determined as follows.

The pad dimensions of a dual use pad 110 are the minimum width for assembly (71 μm) and the minimum length for the probing test (118 μm).

The pad dimensions of a probing test pad 120 are the minimum width for the probing test (47 μm) and the minimum length for the probing test (118 μm).

The pad dimensions of an assembly pad 130 are the minimum width for assembly (71 μm) and the minimum length for assembly (71 μm).

Also, the interval between a dual use pad 110 and a probing test pad 120 is an inter-pad separation distance capable of ensuring insulation (3 μm). The interval between a probing test pad 120 and an assembly pad 130 in a direction perpendicular to the pad pitch direction is a measurement based on constraints in assembly such as, for example, an assembly separation distance (74 μm) that enables simultaneous bonding, bumping, etc. of a dual use pad 110 and an assembly pad 130.

As a result of this type of layout, the pad pitch width is (dual use pad 110 width (71 μm)+probing test pad 120 width (47 μm))/2+inter-pad separation distance (3 μm)=62 μm. The frame width of the first area 102 should be at least 118 μm.

For example, when only dual use pads are simply placed one after another as in the prior art, the pad pitch is the dual use pad 110 width (71 μm)+the separation distance (3 μm)=74 μm, which is over 19% wider than in the present invention. In reality, dual use pads cannot be arranged at 3 μm intervals due to constraints in assembly, and a pad pitch of around 120 μm, for example, is necessary, which is over 93% wider than in the present invention. Even if the frame width of the first area is widened and the dual use pads are disposed in two levels, the frame width of the first area would be at least the minimum width for assembly (71 μm)×2+the separation distance for assembly (74 μm)=216 μm, which is over 95% wider than in the present invention.

Figure 3:
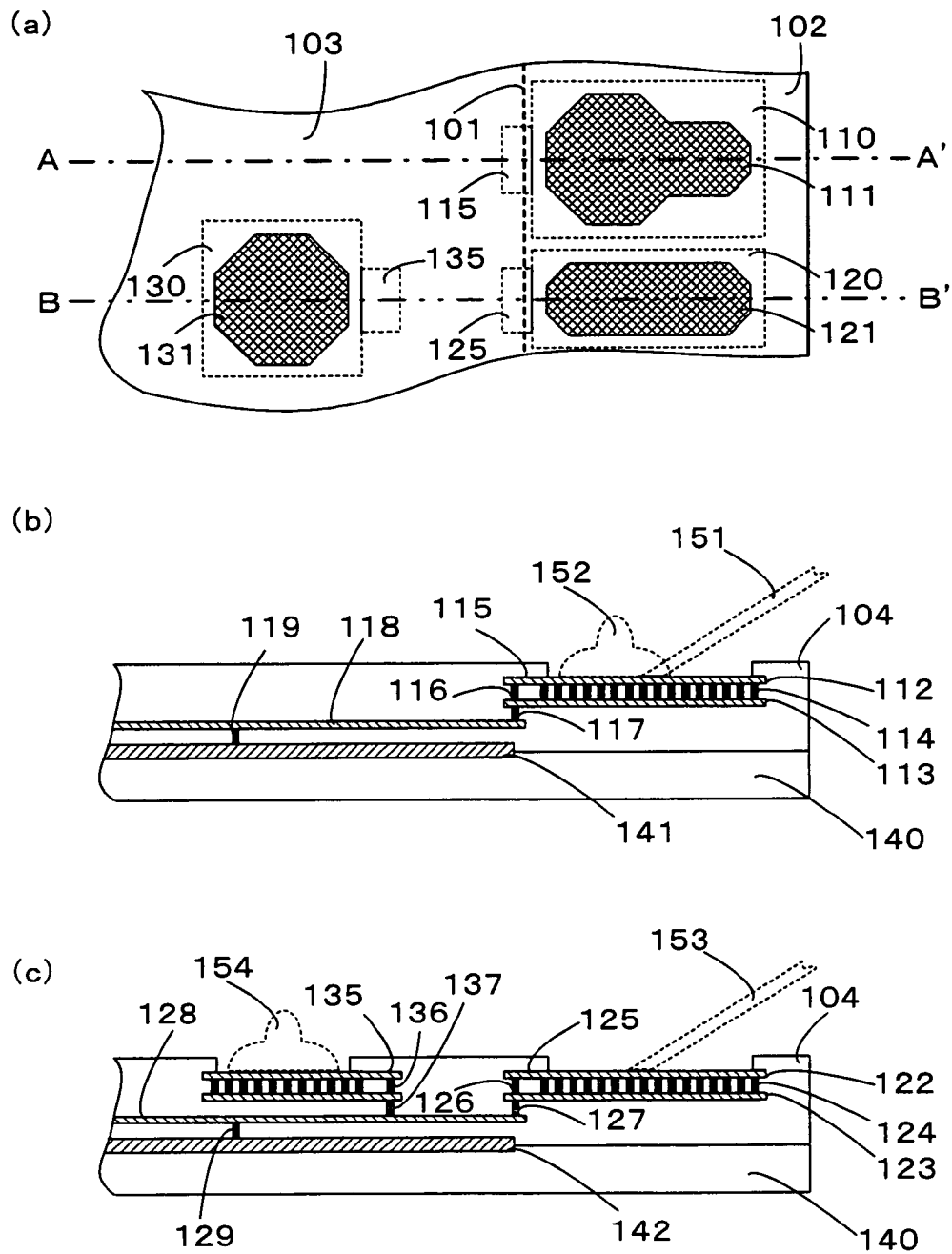
FIG. 3A shows pads when viewed from the main surface.
FIG. 3B is a cross-sectional view taken along dashed dotted line A-A' in FIG. 3A.
FIG. 3C is a cross-sectional view taken along dashed double-dotted line B-B' in FIG. 3A.

FIG. 3A shows pads when viewed from the main surface, FIG. 3B is a cross-sectional view taken along dashed dotted line A-A' in FIG. 3A, and FIG. 3C is a cross-sectional view taken along dashed double-dotted line B-B' in FIG. 3A.

As shown in FIGS. 3A-3C, there is a pad opening 111 above the dual use pad 110, a pad opening 121 above the probing test pad 120, and a pad opening 131 above the assembly pad 130, whereby the portion of the main surface excluding the pad openings is covered with an electrical insulating layer 104.

As shown in FIG. 3B, when the main surface is facing up, the dual use pad 110 is composed of an uppermost metal wiring layer 112, a metal wiring layer 113 therebelow, and a contact cluster 114 (vias) which connects these layers 112 and 113. The dual use pad 110 is connected to a bottom metal layer 118 via a pad slot 115, a contact 116, and a contact 117. The bottom metal layer 118 is connected to the circuit's diffusion area 141, which is formed on a semiconductor substrate 140, via a contact 119. Note that a probe 151 used during wafer testing and a bump 152 for assembly, which is formed during assembly, are shown as dotted lines above the dual use pad 110 in FIG. 3B.

As shown in FIG. 3C, when the main surface is facing up, the probing test pad 120 is composed of an uppermost metal wiring layer 122, a metal wiring layer 123 therebelow, and a contact cluster 124 which connects these layers 122 and 123. Also, the assembly pad 130 is composed of an uppermost metal wiring layer 132, a metal wiring layer 133 therebelow, and a contact cluster 134 which connects these layers 132 and 133. The probing test pad 120 is connected to a bottom metal layer 128 via a pad slot 125, a contact 126, and a contact 127. The assembly pad 130 is connected to the bottom metal layer 128 via a pad slot 135, a contact 136, and a contact 137. The bottom metal layer 128 is connected to the circuit's diffusion area 142, which is formed on the semiconductor substrate 140, via a contact 129. Note that a probe 153 used during wafer testing and a bump 154 for assembly, which is formed during assembly, are shown as dotted lines above the probing test pad 120 and the assembly pad 130, respectively, in FIG. 3C.

Summary

According to the first embodiment of the present invention, if the measurement in the pad pitch direction of the shape compatible with having a probe connected thereto is smaller than the measurement in the pad pitch direction of the shape compatible with only assembly, assembly pads are disposed in an area where pressure by a probe during the probing test is not permitted, and dual use pads and probing test pads are alternately disposed in an area where pressure by a probe during the probing test is permitted. This prevents functional devices beneath the pad from being damaged by stress, enables the pad pitch and the area where pressure during the probing test is permitted to be reduced in comparison to the prior art, and enables a substantial reduction in chip size.

Embodiment 2

Overview

A second embodiment of the present invention eliminates pads exclusively for the probing test from the first embodiment in a case in which it is permissible to have fewer probing test pads than assembly pads. The length of the dual use pads in a direction perpendicular to the pad pitch direction is shortened since the second embodiment is not subject to the slippage constraint of narrow-pitch probes as in the first embodiment, thereby enabling chip size to be further reduced.

Structure

Figure 4:
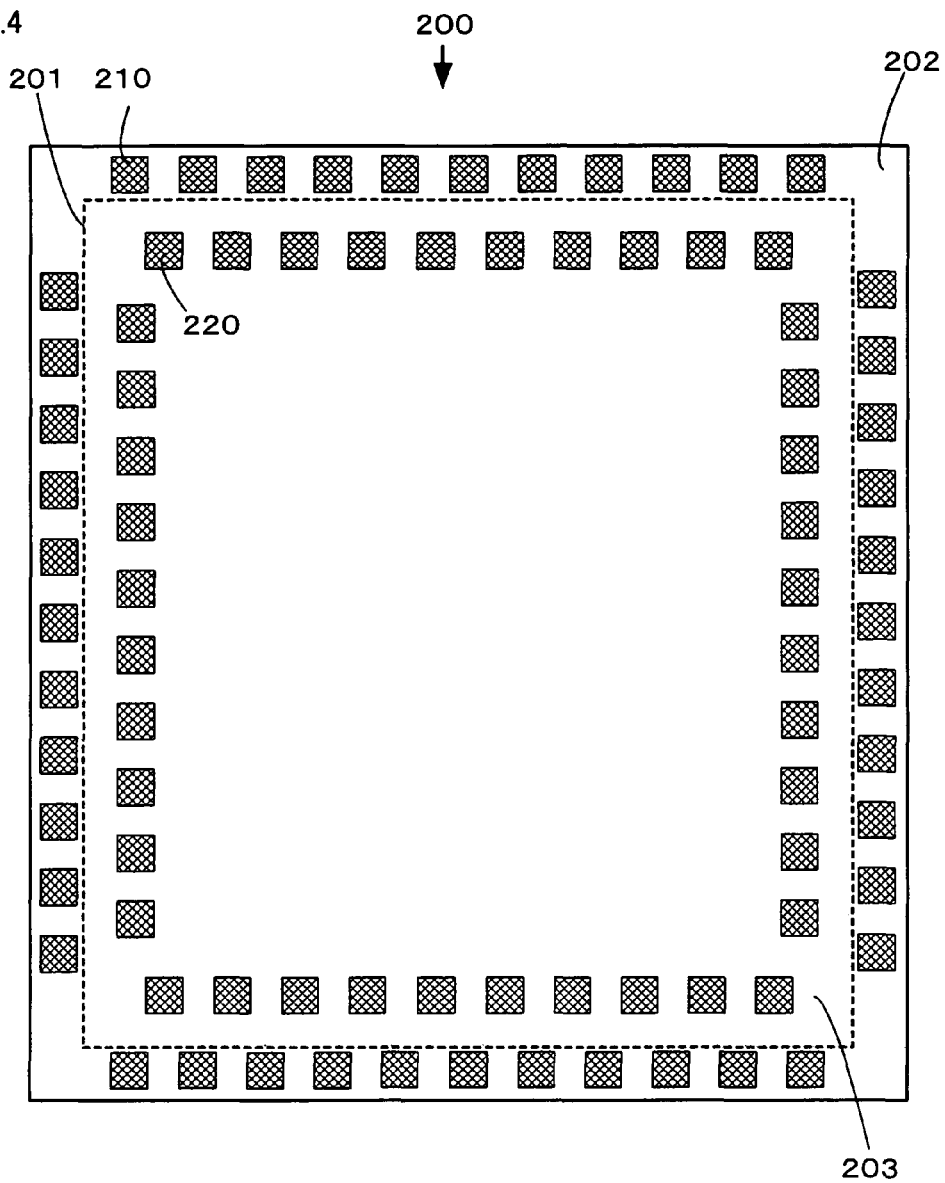
FIG. 4 shows a layout of a plurality of pads that are terminals for external connection, when viewing a semiconductor chip 200 in a second embodiment of the present invention from a main surface.

FIG. 4 shows a layout of a plurality of pads that are terminals for external connection, when viewing a semiconductor chip 200 in a second embodiment of the present invention from a main surface.

As shown in FIG. 4, the main surface of the semiconductor chip 200 is divided into a first area 202 which corresponds to an outer frame portion of the semiconductor chip 200 between a virtual boundary line 201 and the periphery, and a second area 203 which is the portion inside the virtual boundary line 201.

The first area 202 is an area where pressure by a probe during the probing test is permitted. Dual use pads 210, used in both the probing test and assembly, are disposed in this area along a periphery at a predetermined interval necessary in assembly.

Directly below the second area 203, in the interior of the semiconductor chip 200, there is a circuit formation portion (not shown) which has functional devices realizing the chip's unique functions. The second area 203 is an area where pressure by a probe during the probing test is not permitted in order to avoid damage to the circuit formation portion. Assembly pads 220, which are not used in the probing test, are arranged in this area along the virtual boundary line 201 at a predetermined interval necessary in assembly.

Figure 5:
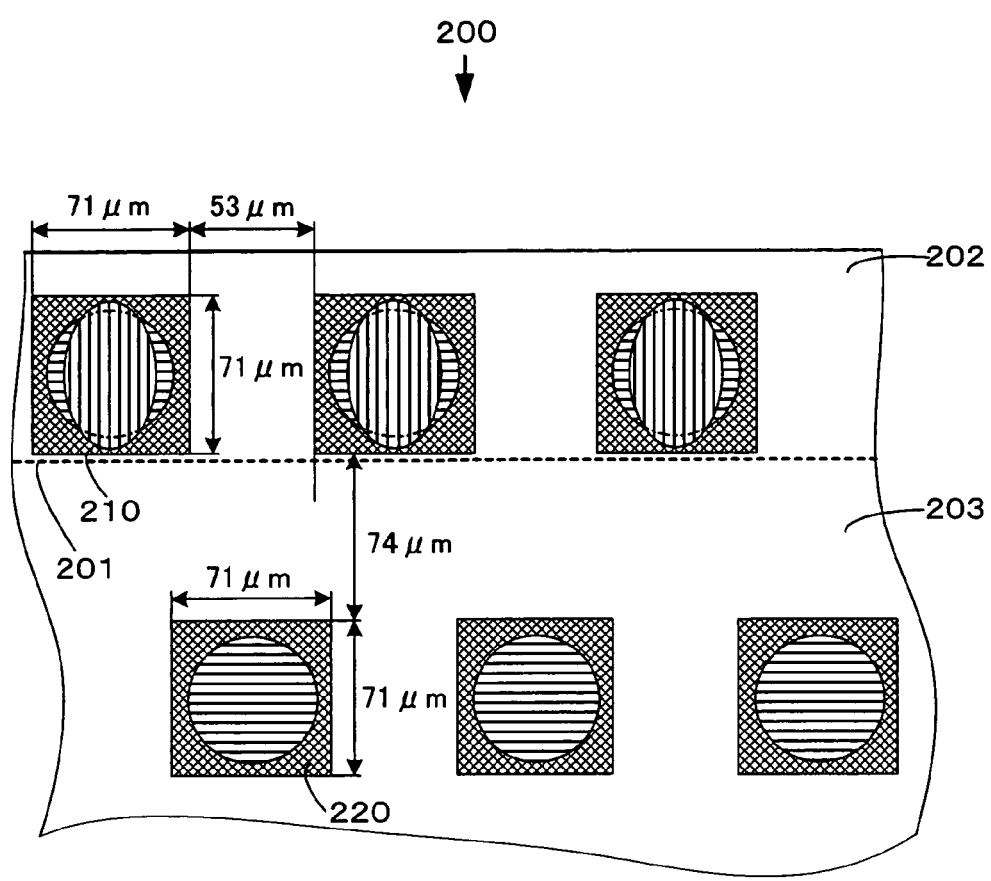
FIG. 5 shows details of shapes and a disposition of the pads.

FIG. 5 shows details of shapes and a disposition of the pads.

In FIG. 5, the circles with horizontal stripes show site occupancy for bonding or bumping, etc. in assembly, and the ellipses with vertical stripes show site occupancy for probing in the probing test.

The minimum dimensions for an assembly pad where stable bonding, bumping, etc. on the pad surface are possible are defined to be a width of 71 μm and a length of 71 μm. The minimum dimensions for a probing test pad, where probing using a wide-pitch probe for 71-μm-wide pads is possible, are defined to be a width of 71 μm and a length of 71 μm.

Given this, the dimensions and layout of the pads are determined as follows.

The pad dimensions of a dual use pad 210 are the minimum width for assembly and the probing test (71 μm)×the minimum length for assembly and the probing test (71 μm). The pad dimensions of an assembly pad 220 are the minimum width for assembly (71 μm)×the minimum length for assembly (71 μm).

Also, the interval between the dual use pads 210 is a measurement based on constraints in assembly, which is 53 μm if the pad pitch is similar to the first embodiment (62 μm). The interval between a dual use pad 210 and an assembly pad 220 in a direction perpendicular to the pad pitch direction is a separation distance for assembly (74 μm) similar to the first embodiment.

As a result of this type of layout, the pad pitch is ((dual use pad 210 width (71 μm)+separation distance (53 μm))/2=62 μm. The frame width of the first area 202 should be at least 71 μm.

When compared with the first embodiment, the pad pitch width is the same. The frame width of the first area, however, is reduced to 60%, from 118 μm to 71 μm.

Figure 6:
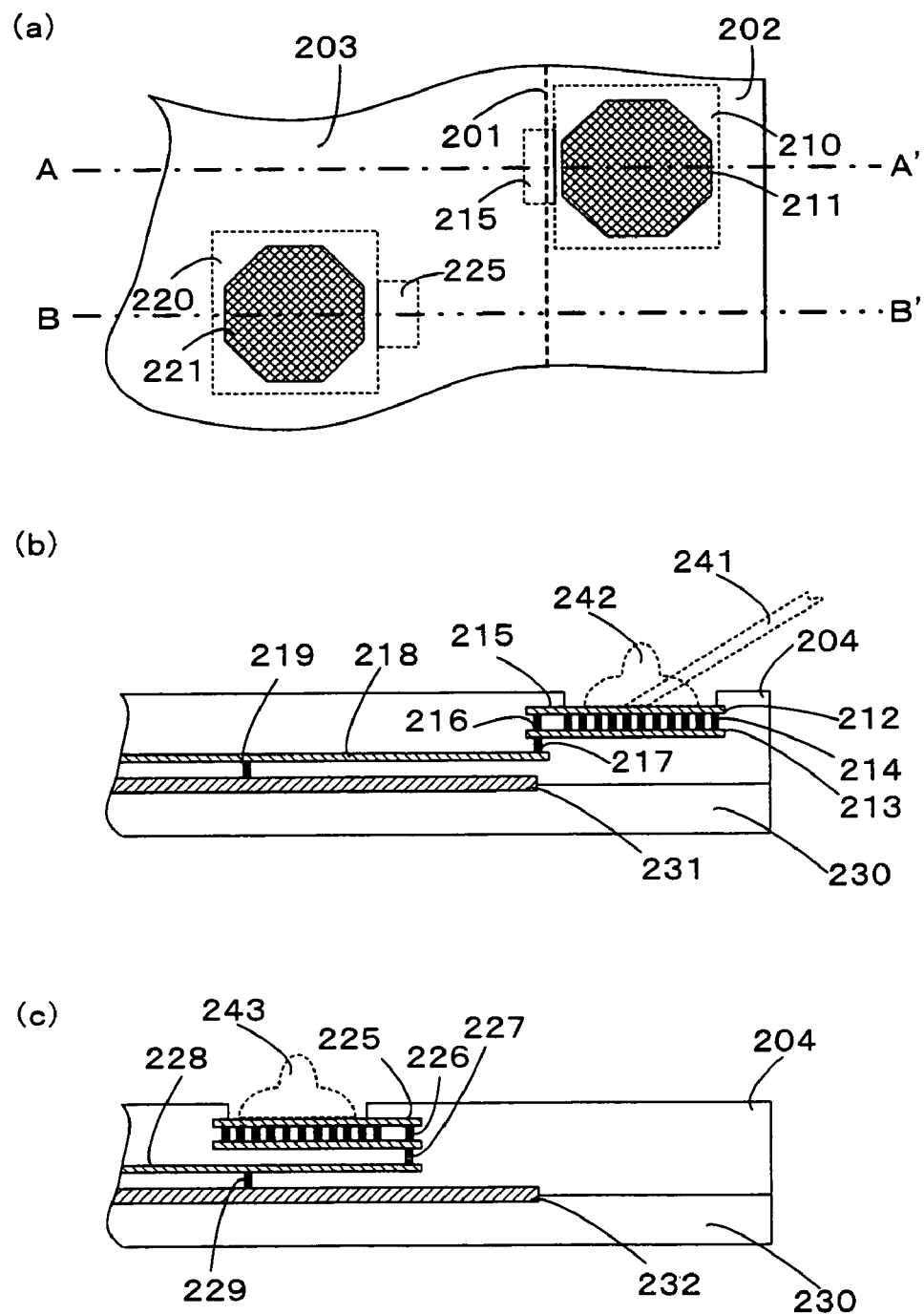
FIG. 6A shows pads when viewed from the main surface.
FIG. 6B is a cross-sectional view taken along dashed dotted line A-A' in FIG. 6A.
FIG. 6C is a cross-sectional view taken along dashed double-dotted line B-B' in FIG. 6A.

FIG. 6A shows pads when viewed from the main surface, FIG. 6B is a cross-sectional view taken along dashed dotted line A-A' in FIG. 6A, and FIG. 6C is a cross-sectional view taken along dashed double-dotted line B-B' in FIG. 6A.

As shown in FIGS. 6A-6C, there is a pad opening 211 above the dual use pad 210 and a pad opening 221 above the assembly pad 220, whereby the portion of the main surface excluding the pad openings is covered with an electrical insulating layer 204.

As shown in FIG. 6B, when the main surface is facing up, the dual use pad 210 is composed of an uppermost metal wiring layer 212, a metal wiring layer 213 therebelow, and a contact cluster 214 which connects these layers 212 and 213. The dual use pad 210 is connected to a bottom metal layer 218 via a pad slot 215, a contact 216, and a contact 217. The bottom metal layer 218 is connected to the circuit's diffusion area 231, which is formed on a semiconductor substrate 230, via a contact 219. Note that a probe 241 used during wafer testing and a bump 242 for assembly, which is formed during assembly, are shown as dotted lines above the dual use pad 210 in FIG. 6B.

As shown in FIG. 6C, when the main surface is facing up, the assembly pad 220 is composed of an uppermost metal wiring layer 222, a metal wiring layer 223 therebelow, and a contact cluster 224 which connects these layers 222 and 223. The assembly pad 220 is connected to a bottom metal layer 228 via a pad slot 225, a contact 226, and a contact 227. The bottom metal layer 228 is connected to the circuit's diffusion area 232, which is formed on a semiconductor substrate 230, via a contact 229. Note that a bump 243 formed during assembly is shown as a dotted line above the assembly pad 220 in FIG. 6C.

Summary

According to the second embodiment of the present invention, in a case in which it is permissible to have fewer probing test pads than assembly pads, the length of the dual use pads in a direction perpendicular to the pad pitch direction can be reduced more than in the first embodiment, to the extent that the measurement is not subject to the slippage constraint of narrow-pitch probes, thereby enabling chip size to be further reduced.

Embodiment 3

Overview

A third embodiment of the present invention proposes a new structure of the interface beneath the pad that enables the chip size of semiconductor chips to be reduced. By excluding wiring such as VDD, VSS, etc., which have a different potential from the pad, from the interface beneath the pad, crack-shorts (shorts resulting from cracks) are structurally prevented from occurring even if pressure is applied to the pad. This drastically increases the degree of freedom in the pad layout, thereby facilitating the reduction of chip size.

Structure

The third embodiment of the present invention shows an example of a semiconductor chip with relatively few wiring layers in which an ESD protection element is formed, using a low cost 3-layer wiring process, below the pad for protection against surges coming from terminals.

Figure 7:
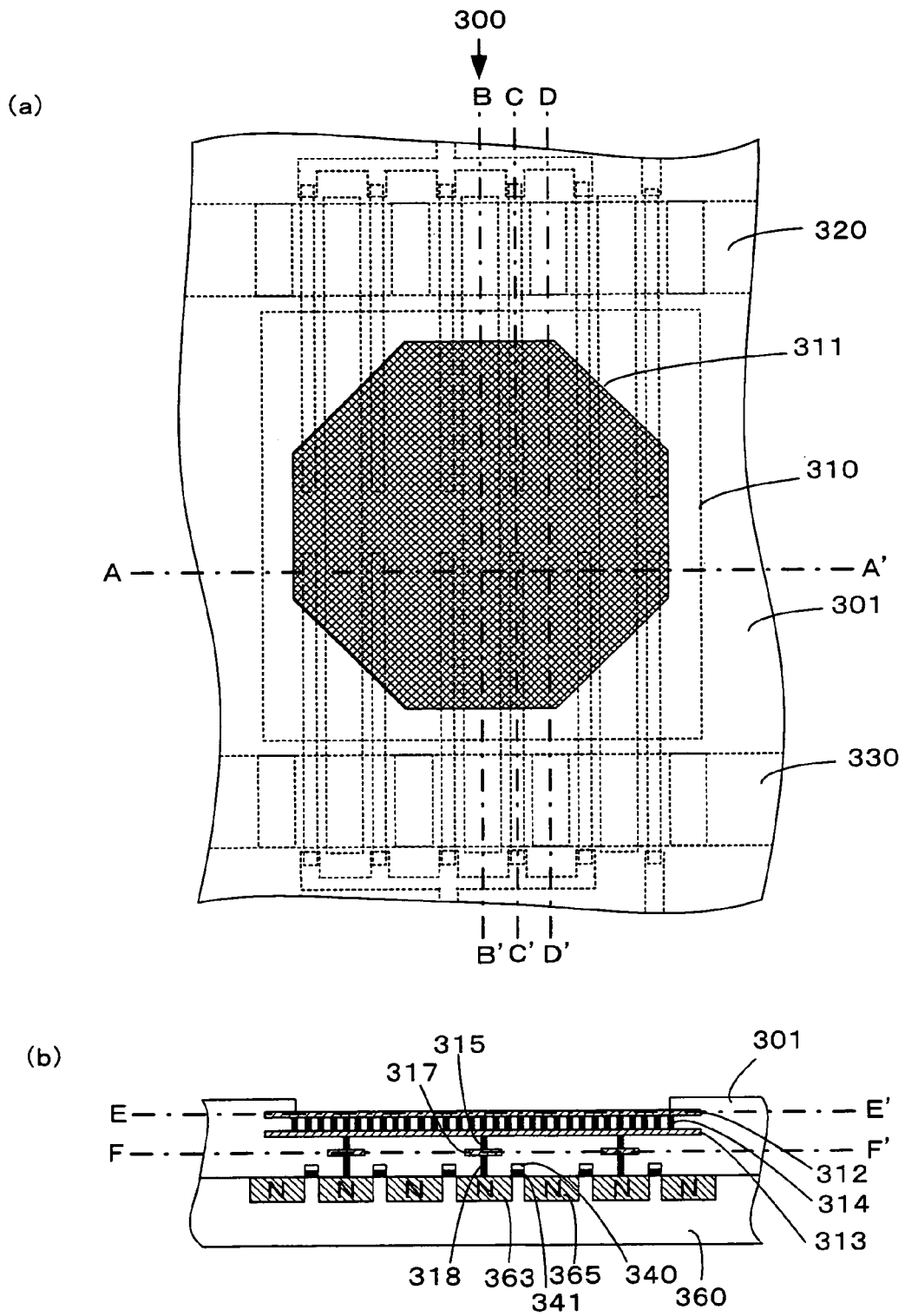
FIG. 7A shows a pad that is a terminal for external connection, a semiconductor chip 300, and a periphery thereof when viewed from a main surface in a third embodiment of the present invention.
FIG. 7B is a cross-sectional view taken along chain line A-A' in FIG. 7A.

FIG. 7A shows a pad that is a terminal for external connection, a semiconductor chip 300, and a periphery thereof when viewed from a main surface in a third embodiment of the present invention, and FIG. 7B is a cross-sectional view taken along chain line A-A' in FIG. 7A.

Figure 8:
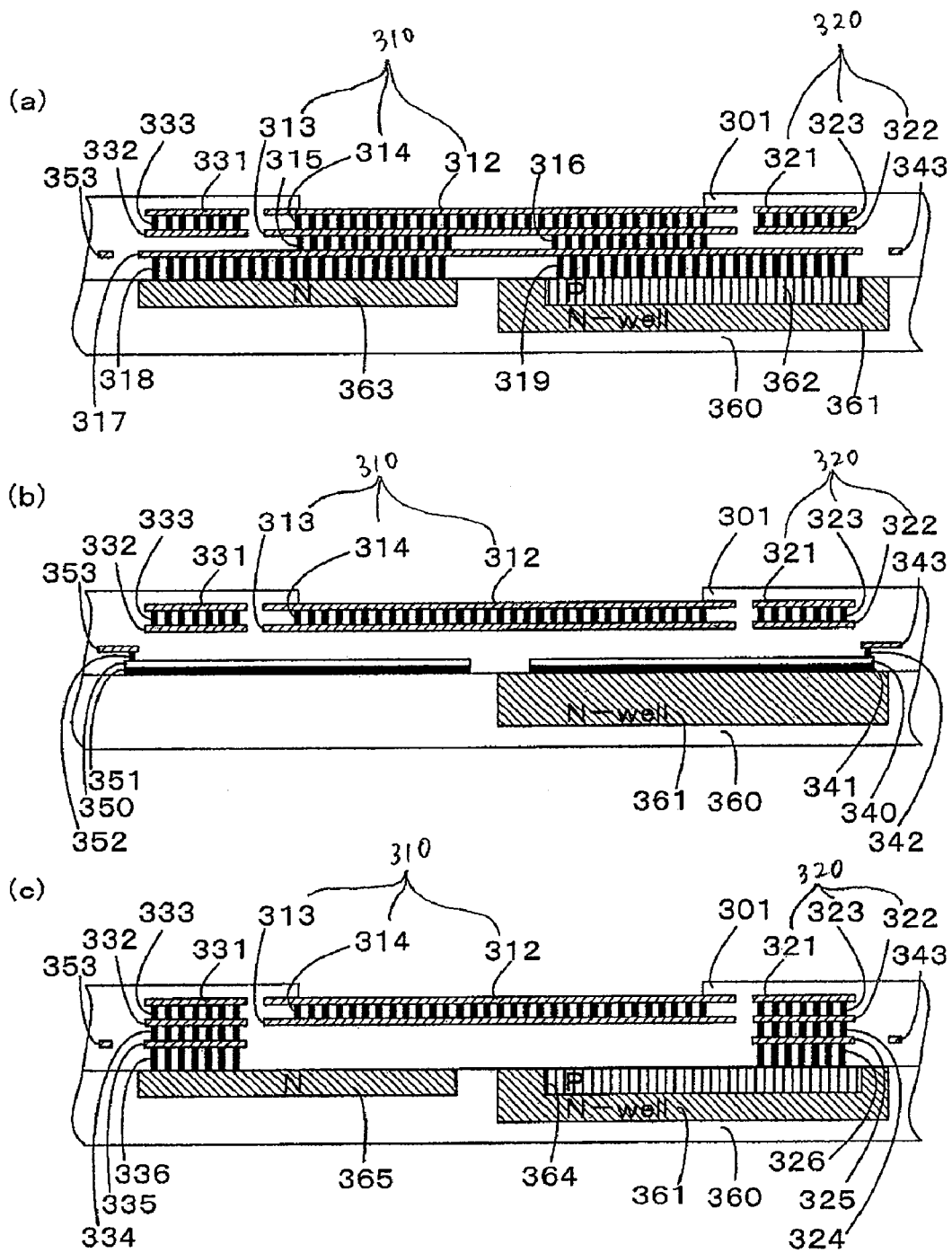
FIG. 8A is a cross-sectional view taken along chain line B-B' in FIG. 7A.
FIG. 8B is a cross-sectional view taken along chain line C-C' in FIG. 7A.
FIG. 8C is across-sectional view taken along chain line D-D' in FIG. 7A.

FIG. 8A is a cross-sectional view taken along chain line B-B' in FIG. 7A, FIG. 8B is a cross-sectional view taken along chain line C-C' in FIG. 7A, and FIG. 8C is a cross-sectional view taken along chain line D-D' in FIG. 7A.

Figure 9:
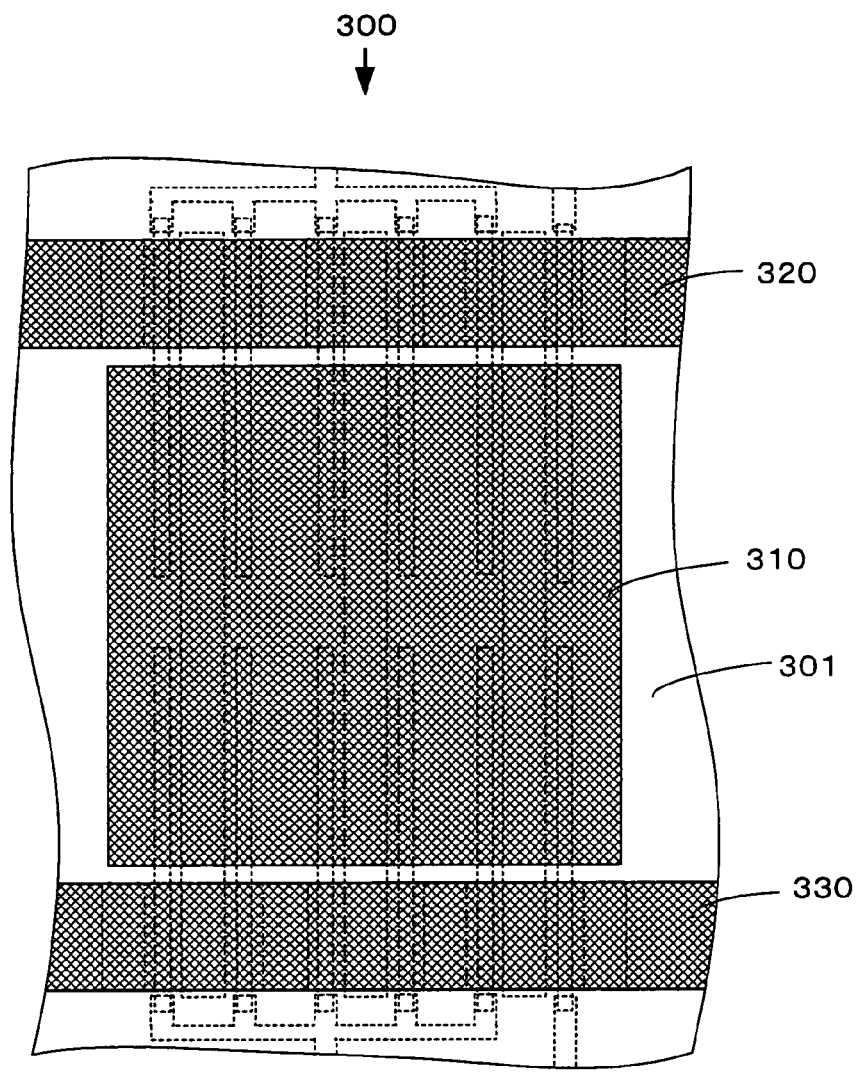
FIG. 9 shows a cross-section parallel to the main surface taken along chain line E-E' in FIG. 7B, and corresponds to a metal wiring pattern of a top layer and an inner layer.

FIG. 9 shows a cross-section parallel to the main surface taken along chain line E-E' in FIG. 7B, and corresponds to a metal wiring pattern of a top layer and an inner layer.

Figure 10:
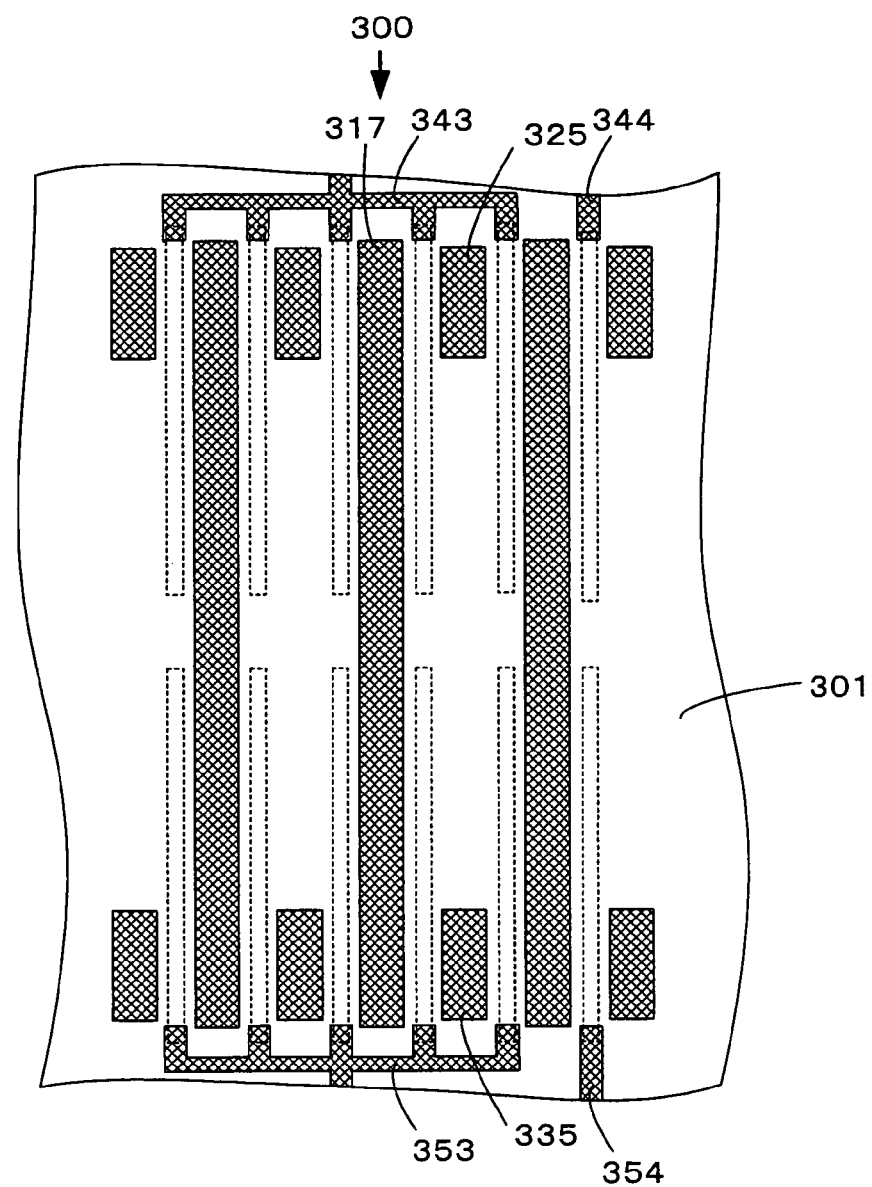
FIG. 10 shows a cross-section parallel to the main surface taken along chain line F-F' in FIG. 7B, and corresponds to the metal wiring pattern of the top layer.

FIG. 10 shows a cross-section parallel to the main surface taken along chain line F-F' in FIG. 7B, and corresponds to the metal wiring pattern of the top layer.

Figure 11:
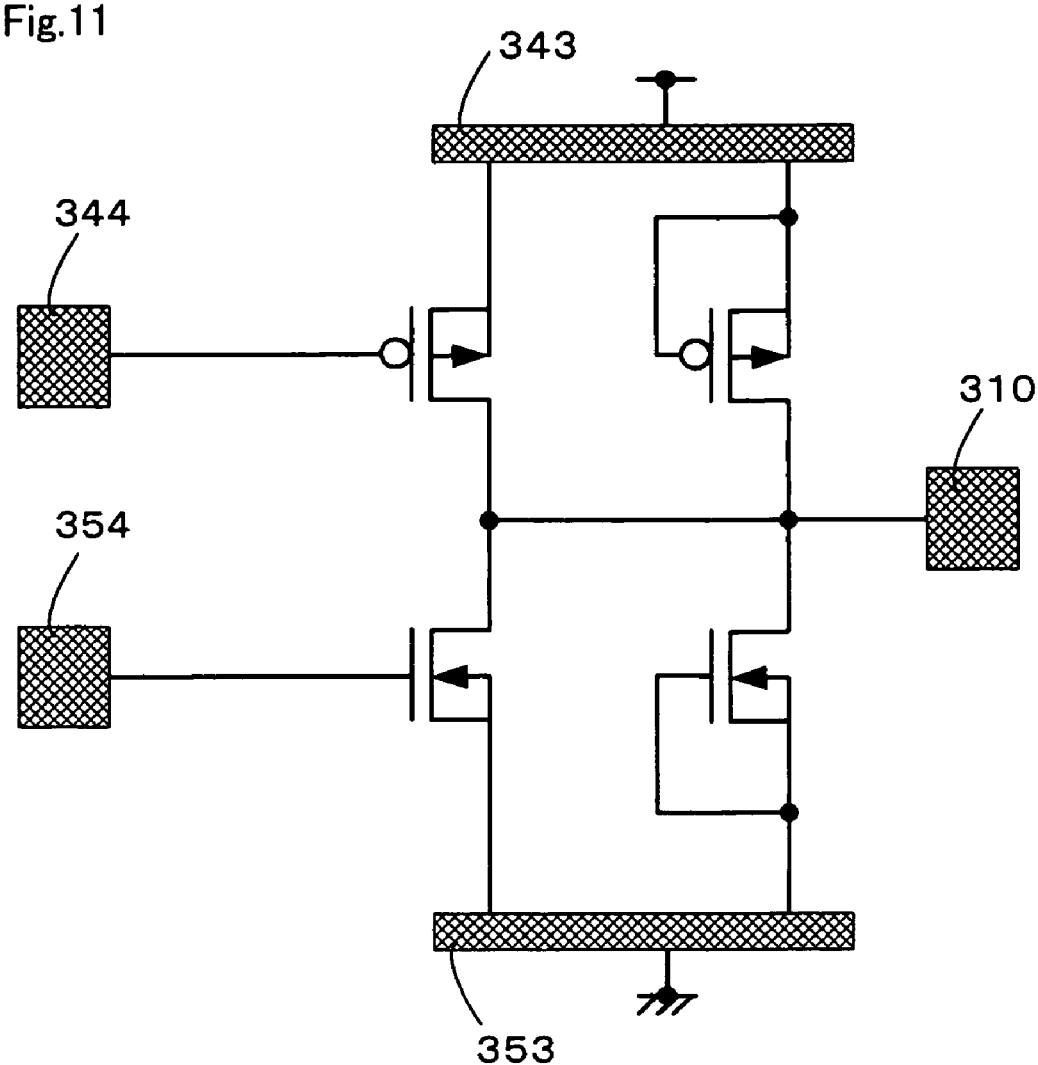
FIG. 11 is a circuit diagram showing a dual use pad and a periphery thereof in a third embodiment of the present invention.

FIG. 11 is a circuit diagram showing a dual use pad and a periphery thereof in the third embodiment of the present invention.

As shown in FIG. 7A, the semiconductor chip 300 has a dual use pad 310 which is used in both the probing test and assembly, and is a terminal for external connection. This pad is disposed between a metal wiring 320 which is supplied by a high voltage power source (hereafter, "VDD") and a metal wiring 330 which is supplied by a low voltage power source (hereafter, "VSS"). There is a pad opening 311 above the dual use pad 310, whereby the portion of the main surface excluding the pad opening 311 is covered with an electrical insulating layer 301.

As shown in FIG. 7B and FIGS. 8A-8C, when the main surface is facing up, the dual use pad 310 is composed of an uppermost metal wiring layer 312, a metal wiring layer 313 therebelow, and a contact cluster 314 which connects these layers 312 and 313. Metal wiring 320 is composed of an uppermost metal wiring layer 321, a metal wiring layer 322 therebelow, and a contact cluster 323 which connects these layers 321 and 322. Metal wiring 330 is composed of an uppermost metal wiring layer 331, a metal wiring layer 332 therebelow, and a contact cluster 333 which connects these layers 331 and 332.

As shown in FIG. 8A-8C, the semiconductor chip 300 has p-type CMOS protection transistors which are formed with a potential of the dual use pad 310 at a drain side, a potential of metal wiring 320 at a source side, and a gate electrode 340 at a gate side; and n-type CMOS protection transistors which are formed with a potential of the dual use pad 310 at a drain side, a potential of metal wiring 330 at a source side, and a gate electrode 350 at a gate side.

As shown in FIG. 8A, the dual use pad 310 is connected to a bottom metal layer 317 via contact clusters 315 and 316. The bottom metal layer 317 is connected, via contact clusters 318 and 319, to a P+ diffusion area 362, being a drain of the p-type CMOS protection transistor formed in an n-type well (n-well) 361 which is on a p-type semiconductor substrate 360, and to an N+ diffusion area 363, being a drain of the n-type CMOS protection transistor formed on the p-type semiconductor substrate 360.

As shown in FIG. 8B, a gate oxide film 341 is formed below the gate electrode 340. The gate electrode 340 is connected to a wiring layer 343, via a contact 342, in a portion not overlapping the dual use pad 310, metal wiring 320, or metal wiring 330, and is connected to other devices. Similarly, a gate oxide film 351 is formed below the gate electrode 350. The gate electrode 350 is connected to a wiring layer 353, via a contact 352, in a portion not overlapping the dual use pad 310, metal wiring 320, or metal wiring 330, and is connected to other devices.

As shown in FIG. 8C, metal wiring 320 is connected to a bottom metal layer 325 via a contact cluster 324. The bottom metal layer 325 is connected, via a contact cluster 326, to a P+ diffusion area 364, being a gate of the p-type CMOS protection transistor formed in an n-type well 361 which is on a p-type semiconductor substrate 360. Metal wiring 330 is connected to a bottom metal layer 335 via a contact cluster 334. The bottom metal layer 335 is connected to an N+ diffusion area 365, being a gate of the n-type CMOS protection transistor formed on the p-type semiconductor substrate 360.

Here, the N+ diffusion area 363 is connected to the bottom metal layer 317 via the contact cluster 318, as shown in FIG. 7B and FIG. 8A. In contrast, as shown in FIG. 7B and FIG. 8C, the N+ diffusion area 365 is constituted with only a diffusion layer and does not have metal wiring below the dual use pad 310. The portion of the N+ diffusion area 365 which does not overlap with the dual use pad 310 is extended by the wiring pad, and is connected to metal wiring 330 via the contact cluster 336, the bottom metal layer 335, and the contact cluster 334.

Similarly, the P+ diffusion area 362 is connected to the bottom metal layer 317 via the contact cluster 319, as shown in FIG. 8A. In contrast, as shown in FIG. 8C, the P+ diffusion area 364 does not have metal wiring below the dual use pad 310 and is constituted with only a diffusion layer. The portion of the P+ diffusion area 364 which does not overlap with the dual use pad 310 is extended by the wiring pad and is connected to metal wiring 320 via the contact cluster 326, the bottom metal layer 325, and the contact cluster 324.

Note that it is desirable to lower the resistance of the source area diffusion layer below the dual use pad 310, which includes the N+ diffusion area 365 and the P+ diffusion area 364, by using a thin film formed on the surface of a salicide diffusion layer, etc.

Also, if the dual use pad 310 is composed of a portion used in the probing test and other portions, the N+ diffusion area 365 and the P+ diffusion area 364 may be constituted with only a diffusion layer below at least a portion used in the probing test without having metal wiring.

Summary

According to the third embodiment of the present invention, by constituting the source area diffusion layer below the pad without metal wiring, crack-shorts fail to occur structurally even if pressure is applied to the pad since metal wiring which has a potential different from the pad is excluded from the interface beneath the pad.

Consequently, this drastically increases the degree of freedom in the pad layout, thereby facilitating the reduction of chip size.

Embodiment 4

Overview

A fourth embodiment of the present invention is a variation of the semiconductor chip in the third embodiment. Only the metal wiring pattern of the bottom layer is different, being made substantially the same size as the pad, and thereby further improving reliability.

Structure

Figure 12:
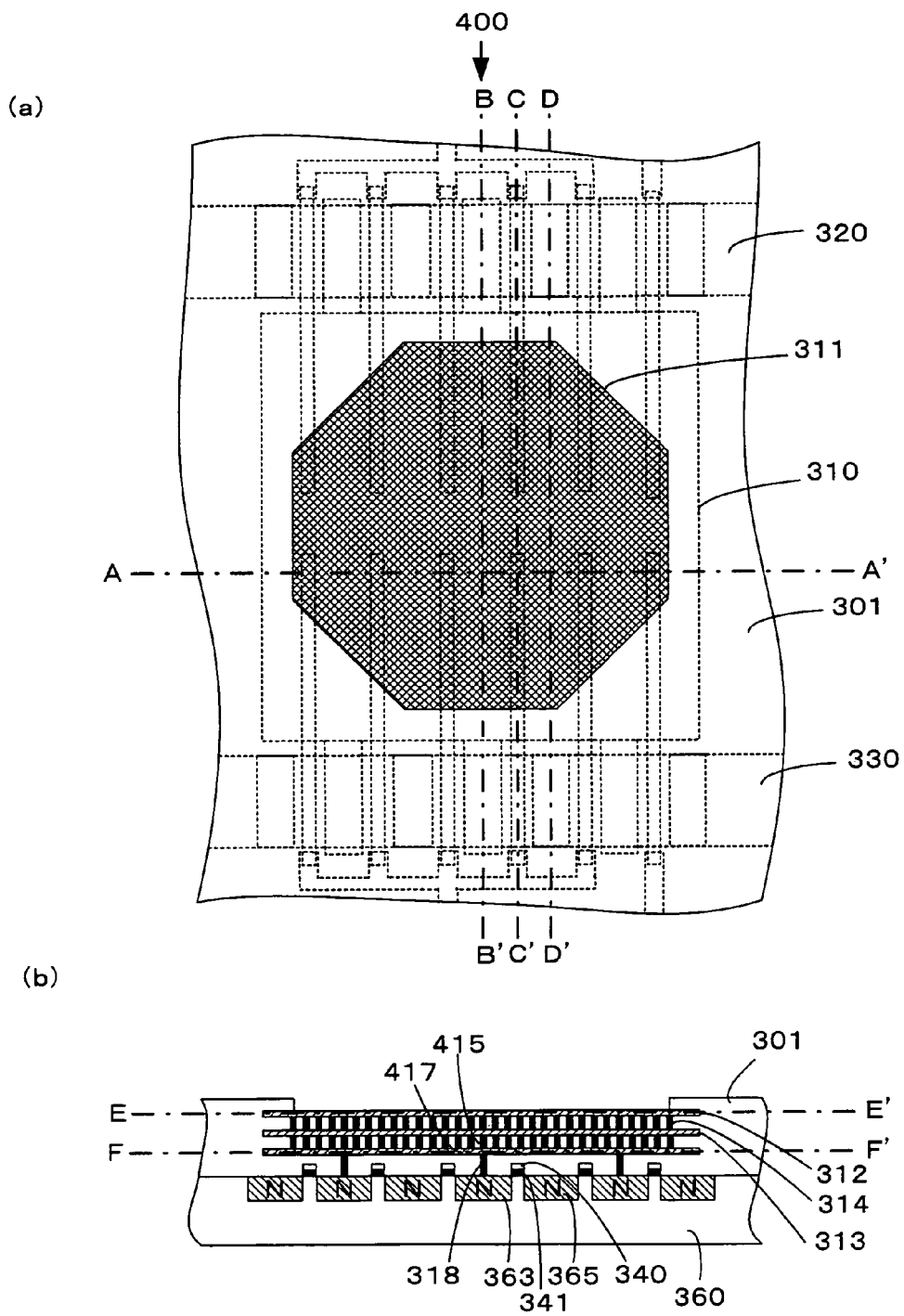
FIG. 12A shows a pad that is a terminal for external connection, a semiconductor chip 400, and a periphery thereof when viewed from a main surface in a fourth embodiment of the present invention.
FIG. 12B is a cross-sectional view taken along chain line A-A' in FIG. 12A.

FIG. 12A shows a pad that is a terminal for external connection, a semiconductor chip 400, and a periphery thereof when viewed from a main surface in a fourth embodiment of the present invention, and FIG. 12B is a cross-sectional view taken along chain line A-A' in FIG. 12A.

Figure 13:
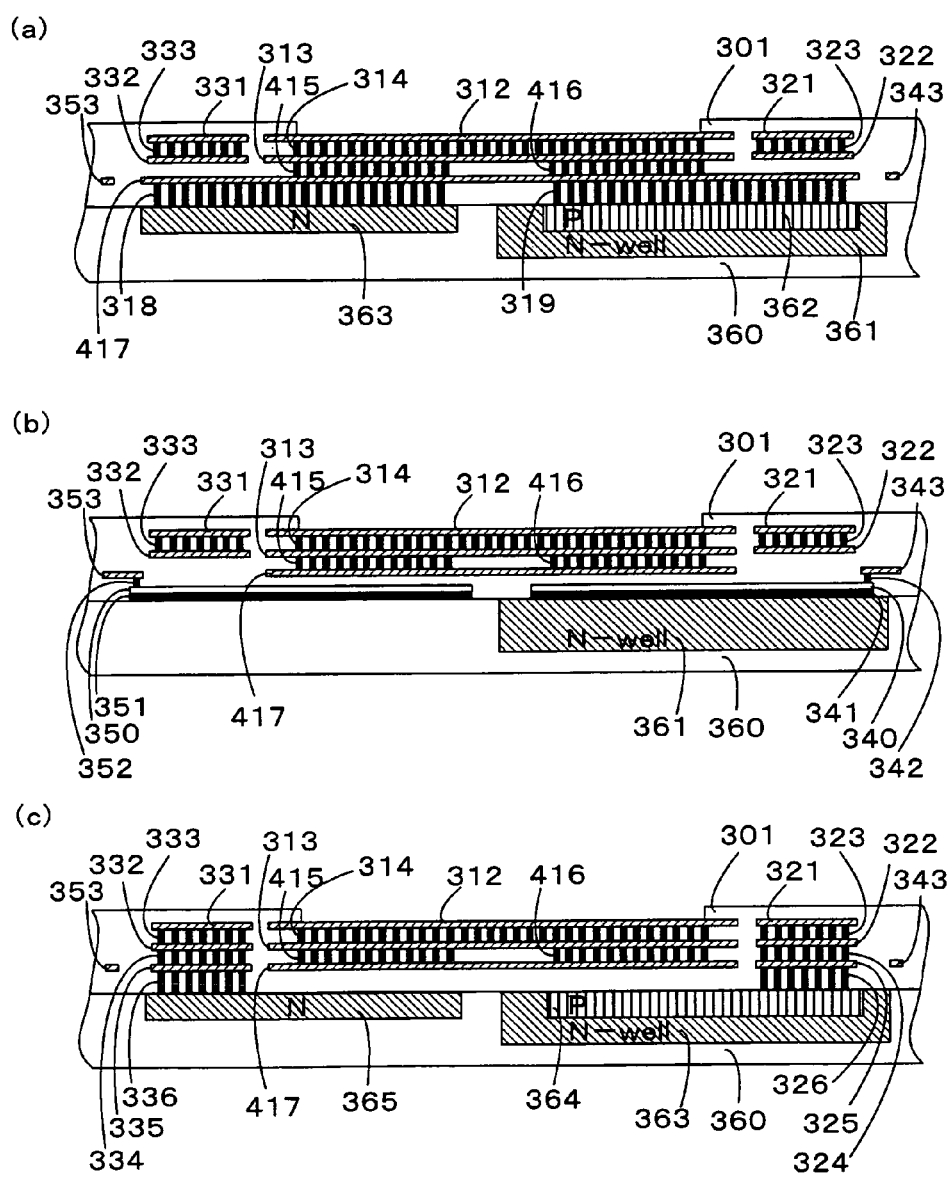
FIG. 13A is a cross-sectional view taken along chain line B-B' in FIG. 12A.
FIG. 13B is a cross-sectional view taken along chain line C-C' in FIG. 12A.
FIG. 13C is a cross-sectional view taken along chain line D-D' in FIG. 12A.

FIG. 13A is a cross-sectional view taken along chain line B-B' in FIG. 12A, FIG. 13B is a cross-sectional view taken along chain line C-C' in FIG. 12A, and FIG. 13C is a cross-sectional view taken along chain line D-D' in FIG. 12A. Here, a figure showing a cross-section parallel to a main surface taken along chain line E-E' in FIG. 12B would be similar to the third embodiment.

Figure 14:
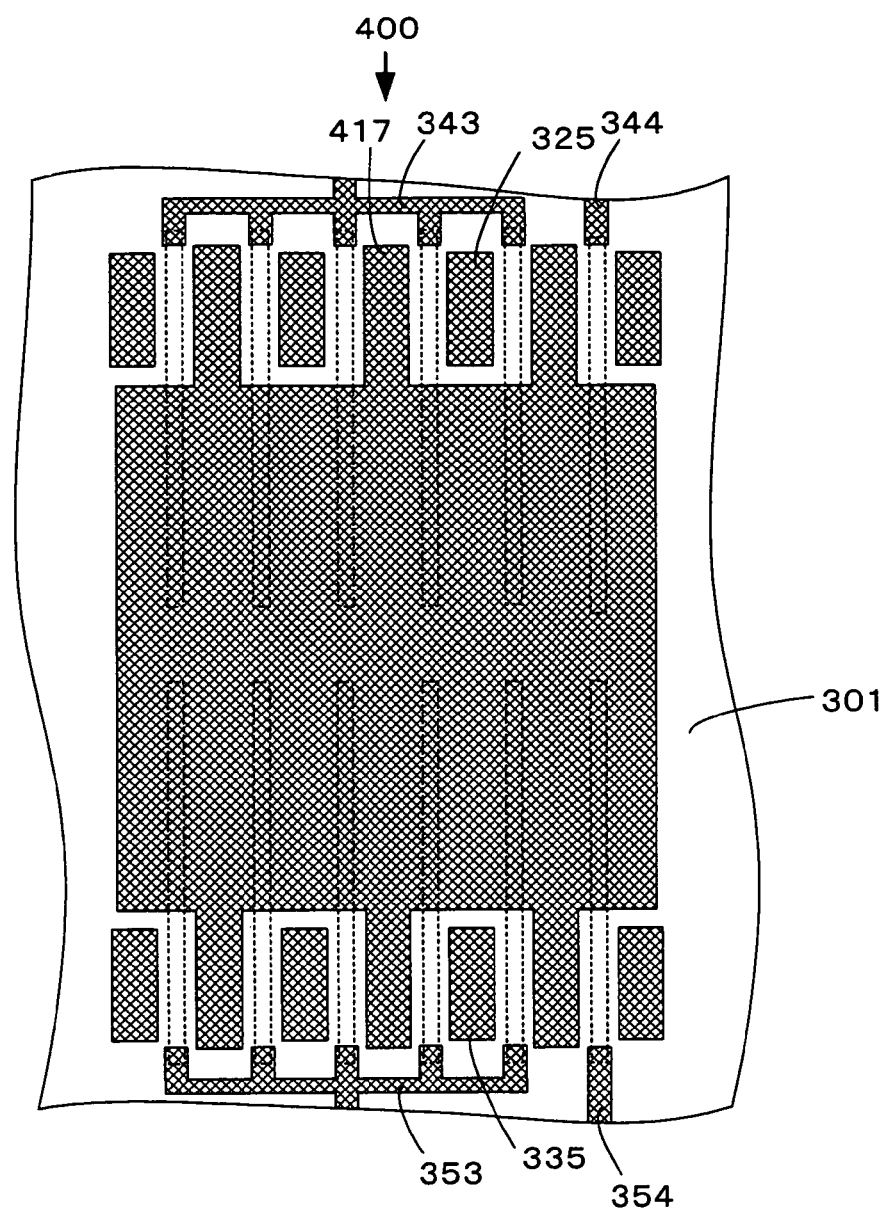
FIG. 14 shows a cross-section parallel to the main surface taken along chain line F-F' in FIG. 12B, and corresponds to a metal wiring pattern of a bottom layer.

FIG. 14 shows a cross-section parallel to the main surface taken along chain line F-F' in FIG. 12B, and corresponds to a metal wiring pattern of a bottom layer.

Note that structural elements similar to the third embodiment have been given the same numbers, and their description is omitted.

In the fourth embodiment of the present invention, the contact cluster 315, the contact cluster 316, and the bottom metal layer 317 of the third embodiment have been replaced with a contact cluster 415, a contact cluster 416, and a bottom metal layer 417, respectively, in the figures.

The shape of the bottom metal layer 417 is a combination of the shapes of the dual use pad 310 and the bottom metal layer 317 in the third embodiment. The shape of the overlapping area of the bottom metal layer 417 and the dual use pad 310 is substantially similar to the shape of the dual use pad 310.

Only the number of contacts in contact clusters 415 and 416 has increased as a result of the modification of the shape of the bottom metal layer 417.

Summary

According to the fourth embodiment of the present invention, the fact that the bottom metal layer is substantially the same size as the pad means that even if a crack occurs in the interface beneath the pad from stress from a probe, bonding, etc., the bottom metal layer effectively functions as a cover layer in order to prevent malfunctions, thereby enabling an increase in the reliability of the semiconductor chip.

Embodiment 5

Overview

A fifth embodiment of the present invention is a variation of the semiconductor chip in the fourth embodiment, whereby only the manner of connection between the bottom metal layer and the pad is different. The connection is performed only at newly provided pad slots instead of below the pad interface, thereby facilitating the analysis of cracks.

Structure

Figure 15:
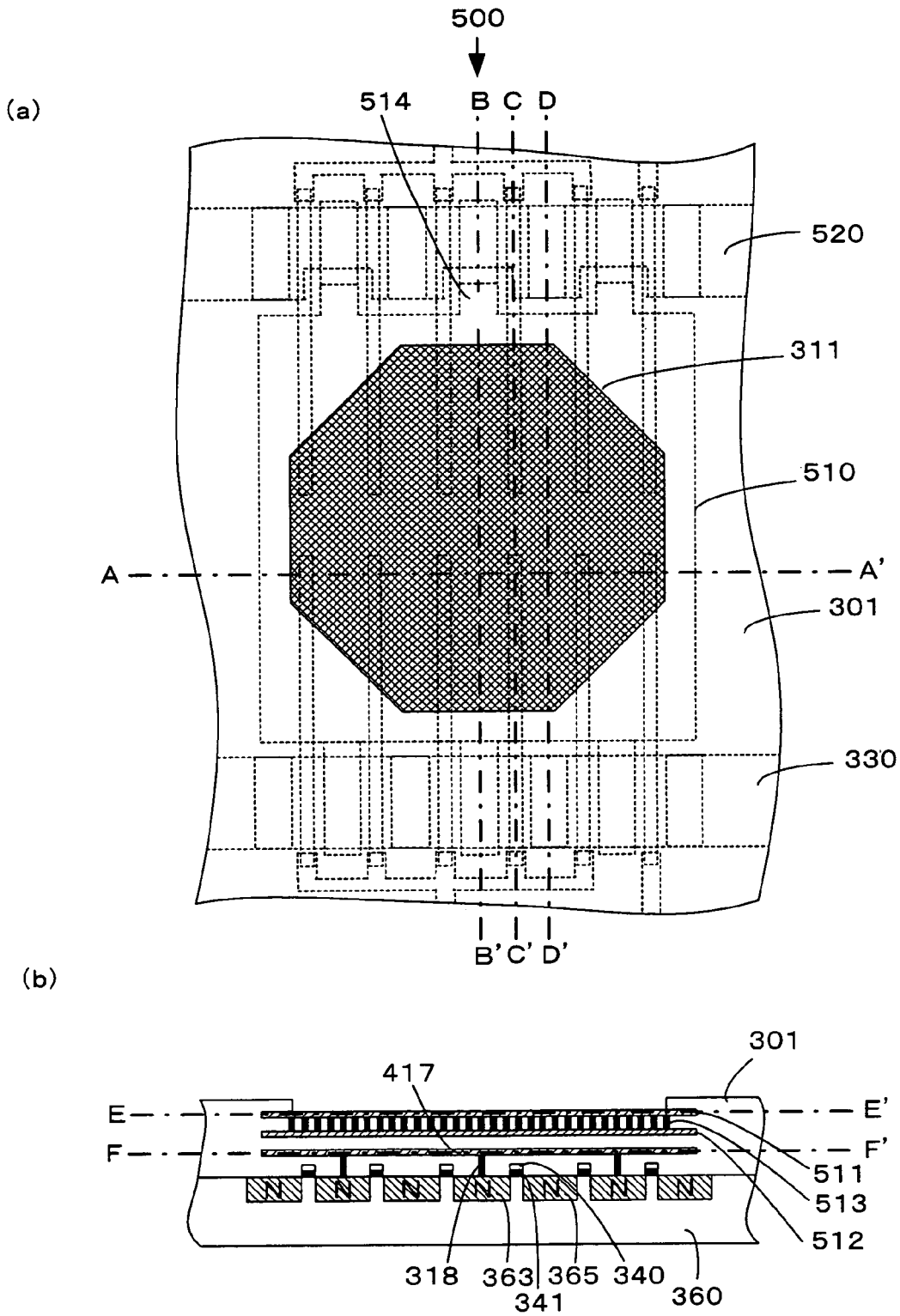
FIG. 15A shows a pad that is a terminal for external connection, a semiconductor chip 500, and a periphery thereof when viewed from a main surface in a fifth embodiment of the present invention.
FIG. 15B is a cross-sectional view taken along chain line A-A' in FIG. 15A.

FIG. 15A shows a pad that is a terminal for external connection, a semiconductor chip 500, and a periphery thereof when viewed from a main surface in a fifth embodiment of the present invention, and FIG. 15B is a cross-sectional view taken along chain line A-A' in FIG. 15A.

Figure 16:
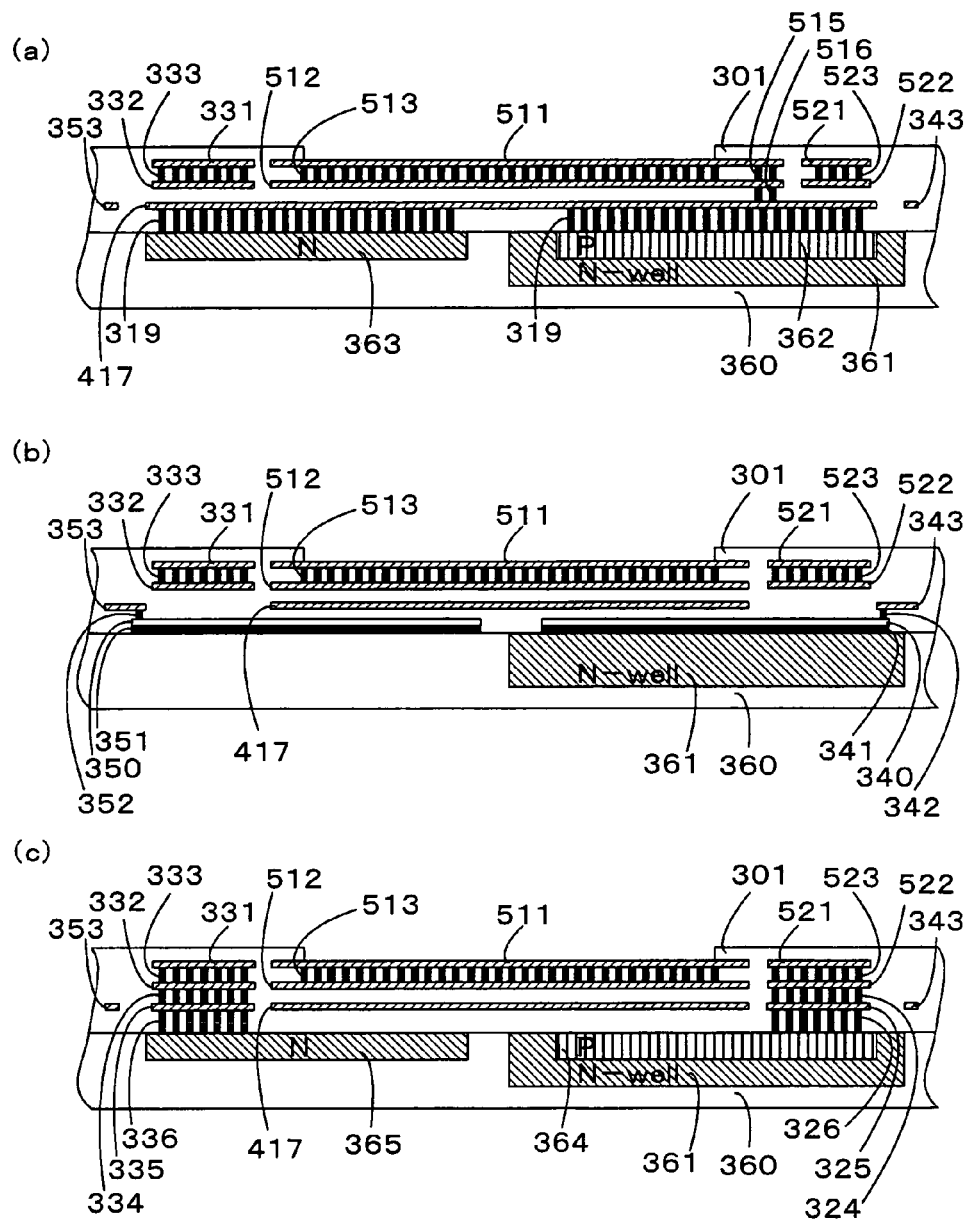
FIG. 16A is a cross-sectional view taken along chain line B-B' in FIG. 15A.
FIG. 16B is a cross-sectional view taken along chain line C-C' in FIG. 15A.
FIG. 16C is a cross-sectional view taken along chain line D-D' in FIG. 15A.

FIG. 16A is a cross-sectional view taken along chain line B-B' in FIG. 15A, FIG. 16B is a cross-sectional view taken along chain line C-C' in FIG. 15A, and FIG. 16C is a cross-sectional view taken along chain line D-D' in FIG. 15A.

Figure 17:
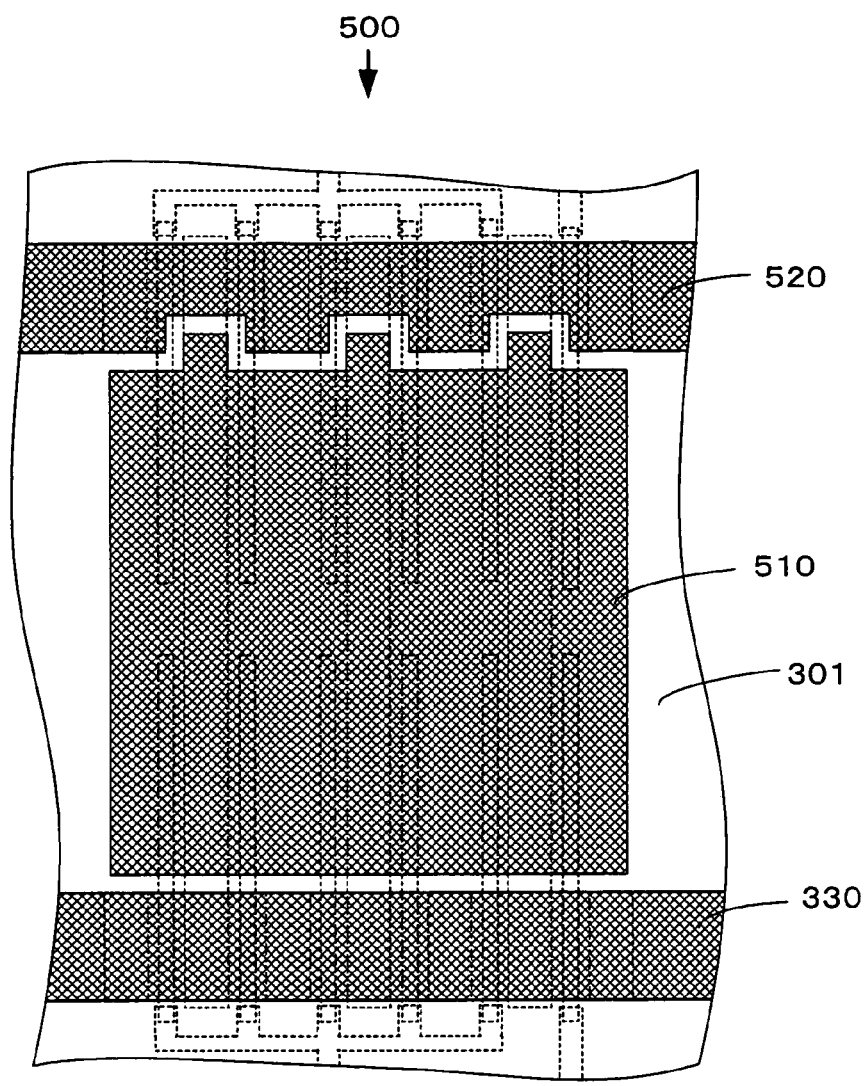
FIG. 17 shows a cross-section parallel to a main surface taken along chain line E-E' in FIG. 16B, and corresponds to a metal wiring pattern of a top layer and an inner layer.

FIG. 17 shows a cross-section parallel to a main surface taken along chain line E-E' in FIG. 16B, and corresponds to a metal wiring pattern of a top layer and an inner layer.

Here, a figure showing a cross-section parallel to a main surface taken along chain line F-F' in FIG. 16B would be similar to the fourth embodiment.

Note that structure elements similar to the third embodiment have been given the same numbers, and their description has thus been omitted.

The dual use pad 310, the uppermost metal wiring layer 312, the metal wiring layer 313, the contact cluster 314, the metal wiring 320, the uppermost metal wiring layer 321, the metal wiring layer 322, and the contact cluster 323 of the fourth embodiment have been replaced with a dual use pad 510, an uppermost metal wiring layer 511, a metal wiring layer 512, a contact cluster 513, a metal wiring 520, an uppermost metal wiring layer 521, a metal wiring layer 522, and a contact cluster 523, respectively, in the fifth embodiment of the present invention. The contact cluster 315 and the contact cluster 316 have been eliminated, while a pad slot 514, a contact cluster 515, and a contact cluster 516 have been added.

Also, in the fifth embodiment of the present invention, contact clusters 315 and 316 which connect the pad and the bottom metal layer below the pad surface have been eliminated, and the shapes of the dual pad 510 and the metal wiring 520 have changed due to the newly-provided pad slot 514. The bottom metal layer and the pad are connected by a contact cluster 515 and a contact cluster 516 at the pad slot 514.

Summary

According to the fifth embodiment of the present invention, it is simple to analyze cracks between the bottom metal layer and the semiconductor substrate since there is no connection between the pad and the bottom metal layer below the pad interface.

INDUSTRIAL APPLICABILITY

The present invention is applicable to all kinds of semiconductor integrated circuits. According to the present invention, cost can be steadily lowered since the size of semiconductor chips can be reduced significantly in comparison with the prior art. The industrial use value of the present invention is therefore extremely high.

The invention claimed is:

1. A semiconductor device having a plurality of pads above a main surface of a semiconductor substrate as terminals for external connection, wherein
   the plurality of pads include dual use pads which are used in both a probing test and assembly, assembly pads which are not used in the probing test, and probing test pads which are not used in assembly,
   the dual use pads and the probing test pads are provided in a first area above the main surface of the semiconductor substrate, an application of pressure by a probe during the probing test being permitted in the first area,
   the assembly pads are provided in a second area above the main surface of the semiconductor substrate, the application of pressure by the probe during the probing test not being permitted in the second area,
   the dual use pads have a shape compatible with both assembly and connection with the probe,
   the assembly pads have a shape compatible with only assembly,
   the probing test pads have a shape compatible with only connection with the probe, and
   a measurement in a pad pitch direction of the shape compatible with only connection with the probe is smaller than a measurement in a pad pitch direction of the shape compatible with only assembly.

2. A semiconductor device having a plurality of pads above a main surface of a semiconductor substrate as terminals for external connection, wherein
   the plurality of pads include dual use pads which are used in both a probing test and assembly, assembly pads which are not used in the probing test, and probing test pads which are not used in assembly,
   the dual use pads and the probing test pads are provided in a first area above the main surface of the semiconductor substrate, an application of pressure by a probe during the probing test being permitted in the first area,
   the assembly pads are provided in a second area above the main surface of the semiconductor substrate, the application of pressure by the probe during the probing test not being permitted in the second area, and
   the first area corresponds to the area above the peripheral region of the main surface of the semiconductor substrate, and the dual use pads and the probing test pads are arranged alternately and along the periphery of the main surface of the semiconductor substrate.

3. The semiconductor device of claim 2, wherein the dual use pads have a shape compatible with both assembly and connection with the probe, and the assembly pads have a shape compatible with only assembly.

* * * * *